United States Patent
Watanabe et al.

(10) Patent No.: US 12,012,668 B2
(45) Date of Patent: Jun. 18, 2024

(54) BISMUTH-SUBSTITUTED RARE EARTH IRON GARNET SINGLE CRYSTAL, FARADAY ROTATOR, OPTICAL ISOLATOR, AND METHOD FOR PRODUCING BISMUTH-SUBSTITUTED RARE EARTH IRON GARNET SINGLE CRYSTAL

(71) Applicant: Shin-Etsu Chemical Co., Ltd., Tokyo (JP)

(72) Inventors: Toshiaki Watanabe, Annaka (JP); Satoru Fukuda, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 113 days.

(21) Appl. No.: 17/995,989

(22) PCT Filed: Dec. 18, 2020

(86) PCT No.: PCT/JP2020/047327
§ 371 (c)(1),
(2) Date: Oct. 12, 2022

(87) PCT Pub. No.: WO2021/215047
PCT Pub. Date: Oct. 28, 2021

(65) Prior Publication Data
US 2023/0212783 A1 Jul. 6, 2023

(30) Foreign Application Priority Data
Apr. 21, 2020 (JP) .................. 2020-075707

(51) Int. Cl.
*C30B 15/20* (2006.01)
*C30B 15/10* (2006.01)
(Continued)

(52) U.S. Cl.
CPC .............. *C30B 29/28* (2013.01); *C30B 15/10* (2013.01); *C30B 15/14* (2013.01); *C30B 15/30* (2013.01); *G02F 1/093* (2013.01)

(58) Field of Classification Search
CPC ......... C30B 15/00; C30B 15/10; C30B 15/14; C30B 15/20; C30B 15/30; C30B 29/00;
(Continued)

(56) References Cited

U.S. PATENT DOCUMENTS

| | | | |
|---|---|---|---|
| 5,616,176 A | 4/1997 | Fukuda et al. | |
| 2003/0219261 A1* | 11/2003 | Ohido | H01F 41/28 398/207 |
| 2014/0021418 A1* | 1/2014 | Shiroki | C30B 29/34 252/582 |

FOREIGN PATENT DOCUMENTS

JP 3490143 B2 1/2004

* cited by examiner

*Primary Examiner* — Kenneth A Bratland, Jr.
(74) *Attorney, Agent, or Firm* — HAUPTMAN HAM, LLP

(57) ABSTRACT

A bismuth-substituted rare earth iron garnet single crystal suitable for Faraday rotators and optical isolators with reduced insertion loss due to suppressed valence fluctuation of Fe ions is provided. The bismuth-substituted rare earth iron garnet single crystal of the present invention is characterized by the composition formula $(Tb_a Ln_b Bi_c Mg_{3-(a+b+c)})(Fe_d Ga_e Ti_f Pt_{5-(d+e+f)})O_{12}$. In the composition formula above, $0.02 \leq f \leq 0.05$, $0.02 \leq \{3-(a+b+c)\} \leq 0.08$, and $-0.01 \leq \{3-(a+b+c)\} - \{f+5-(d+e+f)\} \leq 0.01$. Ln is a rare earth element and may be selected from Eu, Gd, Ho, Tm, Yb, Lu, and Y.

6 Claims, 2 Drawing Sheets

(51) Int. Cl.
  *C30B 15/14* (2006.01)
  *C30B 15/30* (2006.01)
  *C30B 29/28* (2006.01)
  *G02F 1/09* (2006.01)

(58) Field of Classification Search
  CPC ......... C30B 29/10; C30B 29/16; C30B 29/22; C30B 29/28; G02F 1/01; G02F 1/09; G02F 1/093
  USPC .......... 117/11, 13, 19, 54, 73, 937, 944, 945
  See application file for complete search history.

BISMUTH-SUBSTITUTED RARE EARTH IRON GARNET SINGLE CRYSTAL, FARADAY ROTATOR, OPTICAL ISOLATOR, AND METHOD FOR PRODUCING BISMUTH-SUBSTITUTED RARE EARTH IRON GARNET SINGLE CRYSTAL

RELATED APPLICATIONS

The present application is a National Phase of International Application Number PCT/JP2020/047327 filed Dec. 18, 2020, which claims the benefit of priority from Japanese Patent Application No. 2020-075707, filed on Apr. 21, 2020.

TECHNICAL FIELD

The present invention relates to an optical isolator used in opto-processing and optical measurement and a crystal for a Faraday rotator used therein.

BACKGROUND ART

In a laser light source used in an opto-processing machine or an optical measuring machine, laser oscillation becomes unstable when the emitted laser light is reflected on the surface of a material provided in the propagation path and the reflected light returns to the laser light source. In order to block such reflected and returned light, an optical isolator using a Faraday rotator which non-reciprocally rotates the polarization plane is used.

Conventionally, as materials for magneto-optical elements such as optical isolators, bismuth-substituted rare earth iron garnet single crystals grown on substrate crystals by liquid phase epitaxial method are used. Pb (lead) ions derived from lead oxide as a flux component used in manufacturing and Pt (platinum) ions from platinum as a crucible material are mixed into these garnet single crystals. As a result, the valence of Fe (iron) ions, which exist as trivalent ions in garnet single-crystals, fluctuates to divalent or tetravalent, which results in a decrease in light transmittance of garnet single crystals.

When garnet single crystals containing Fe ions of valence other than trivalent as described above are used in optical isolators and magneto-optical elements, optical absorption at wavelengths commonly used in optical processing and optical measurement (0.8 μm, 1.3 μm, 1.55 μm) increases, resulting in increased insertion loss in optical isolators and magneto-optical elements.

As a method to reduce insertion loss in optical isolators, it is known that a metal oxide such as $TiO_2$ is put into a crucible material such as a platinum crucible together with other materials when garnet single crystals are produced, and a small amount of Ti (titanium) is added to the garnet single crystal to balance with Pt ions dissolved from the platinum crucible and suppress valence fluctuation of Fe ions. However, the amount of Ti required to balance the trace amounts of Pt ions dissolved from the platinum crucible is also very small. Therefore, the amount of $TiO_2$ put into the Pt crucible to introduce Ti into the garnet single-crystal is also very small, and it is difficult to introduce Ti uniformly so that it is balanced with Pt ions in all areas of the garnet single-crystal.

PRIOR ART REFERENCES

Patent Documents

Patent Document 1: Japanese Patent No. 3490143

SUMMARY OF THE INVENTION

Problems to be Solved by the Invention

The purpose of the present invention is to provide bismuth-substituted rare earth iron garnet single crystals suitable for Faraday rotators and optical isolators with reduced insertion loss due to suppressed valence fluctuation of Fe ions.

Means for Solving the Problems

The inventors have found that it is easy to reduce insertion loss by adding an excess of MgO along with $TiO_2$ to the raw material melt when growing garnet single crystals and by balancing the composition ratio of Pt and Ti combined with that of Mg.

In other words, to solve the above problem, the bismuth-substituted rare earth iron garnet single crystal of the present invention is characterized by the composition formula $(Tb_aLn_bBi_cMg_{3-(a+b+c)})(Fe_dGa_eTi_fPt_{5-(d+e+f)})O_{12}$. In the composition formula above, $0.02 \le f \le 0.05$, $0.02 \le \{3-(a+b+c)\} \le 0.08$, and $-0.01 \le \{3-(a+b+c)\}-\{f+5-(d+e+f)\} \le 0.01$. Ln is a rare earth element and may be selected from Eu, Gd, Ho, Tm, Yb, Lu, and Y. A plurality of these rare earth elements may be used simultaneously. The bismuth-substituted rare earth iron garnet single crystal may be grown with a PbO-free melt composition.

This configuration facilitates adjustment of the composition of the single crystal growth melt by adding Ti, and Mg, which are valence fluctuating elements in excess, rather than simply suppressing the valence fluctuation of Fe caused by the amount of Pt mixed in as impurities with high precision. It also expands the adjustment range of divalent and tetravalent ions in the grown crystals, resulting in suppression of the generation of $Fe^{2+}$ and $Fe^{4+}$ ions, which are light absorption factors. However, adding too much excess Ti and Mg will reduce the ratio of Fe elements in the single crystal, resulting in a decrease in Faraday rotation ability per unit length. In other words, the longer Faraday rotator length increases the crystal growth time. In addition, even if the insertion loss per unit length is equal, the increase in Faraday rotator length leads to an increase in insertion loss. Moreover, the longer Faraday rotator length increases the optical isolator. This leads to disadvantages such as enlarged isolator geometry. To solve these problems, the upper limit of Ti composition ratio is 0.08 or less, and the upper limit of Mg composition ratio is 0.05 or less.

The Faraday rotator is characterized in that it is composed of the above bismuth-substituted rare earth iron garnet single crystal described above. The optical isolator is characterized in that it is composed of the Faraday rotator described above.

The method for producing bismuth-substituted rare earth iron garnet single crystal according to the present invention comprises: a step of preparing a garnet single crystal substrate as a base substrate; a step of melting a metal oxide containing at least $TiO_2$ and MgO as raw materials in a platinum crucible to prepare a raw material melt; and a step of bringing the base substrate into contact with the raw material melt and pulling up the base substrate, thereby growing a bismuth-substituted rare earth iron garnet single crystal film. In the production method, the raw material melt may have a PbO-free composition.

Effects of Invention

The present invention is a method for easily controlling the valence fluctuation of Fe ions caused by dissolved Pt ions with a small amount of additive elements when growing garnet single-crystal films in a Pt crucible, and garnet single-crystal films with low insertion loss can be easily obtained.

DESCRIPTION OF EMBODIMENTS

Figure 1:
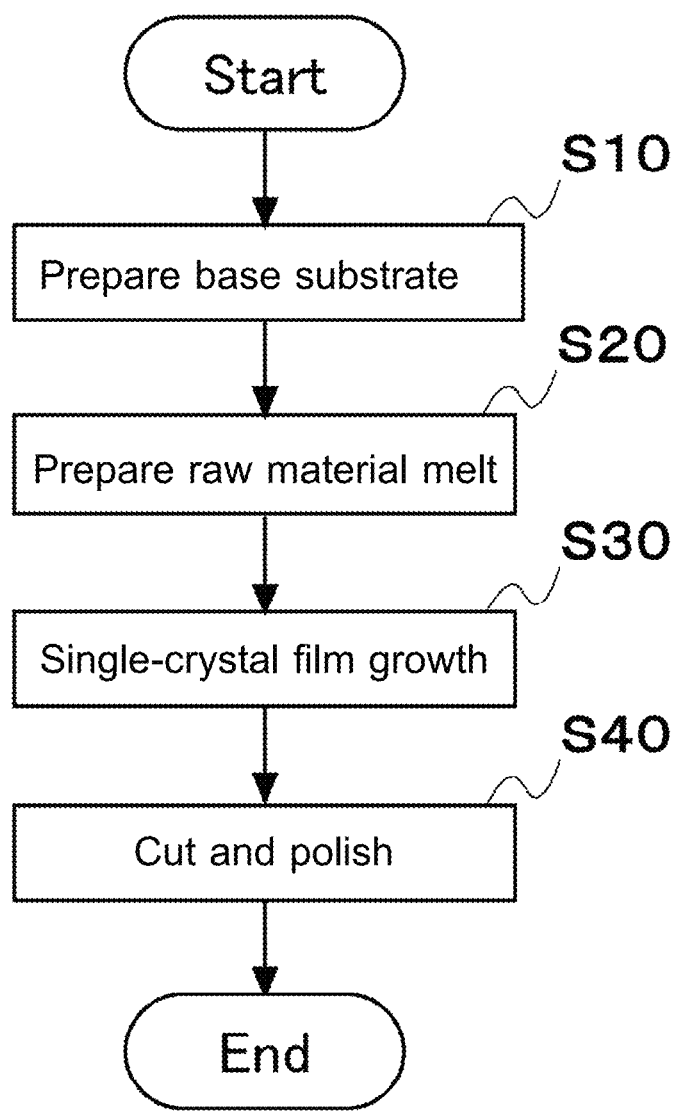
FIG. 1 shows a flowchart of the method for producing bismuth-substituted rare earth iron garnet single crystal.

Hereinafter, embodiments of the present invention will be described in detail, but the present invention is not limited thereto.

<Composition of Bismuth-Substituted Rare Earth Iron Garnet Single Crystal>

The following is a description of the bismuth-substituted rare earth iron garnet single crystal of the present invention. This bismuth-substituted rare earth iron garnet single crystal is suitable for use in a Faraday rotator and an optical isolator. The bismuth-substituted rare earth iron garnet single crystal is represented by the following composition formula (1).

$$(Tb_aLn_bBi_cMg_{3-(a+b+c)})(Fe_dGa_eTi_fPt_{5-(d+e+f)})O_{12} \quad (1)$$

Ln in the composition formula (1) is a rare earth element selected from Eu, Gd, Ho, Tm, Yb, Lu, and Y. A plurality of these rare earth elements may be used simultaneously. In the composition formula (1), $0.02 \le f \le 0.05$, $0.02 \le \{3-(a+b+c)\} \le 0.08$, $-0.01 \le \{3-(a+b+c)\}-\{f+5-(d+e+f)\} \le 0.01$, $a>0$, $b>0$, $c>0$, $d>0$, $e>0$, and $0<d+e+f<5.0$.

In composition formula (1), Ln, Bi, and Fe are elements added to improve the Verde constant and light transmittance of the garnet single crystal. In particular, Fe is highly effective in improving the Verde constant and can be stably present as a trivalent ion in the garnet single crystal.

In composition formula (1), Pt is taken into the crystal by dissolving out of the platinum crucible used to produce the garnet single crystal. In composition formula (1), Ti and Mg are elements added to suppress valence fluctuations of Fe ions caused by Pt ions dissolved from the platinum crucible. As mentioned above, the range of f, which indicates the composition ratio of Ti, is $0.02 \le f \le 0.05$, and the range of $\{3-(a+b+c)\}$, which indicates the composition ratio of Mg, is $0.02 \{3-(a+b+c)\} \le 0.08$.

By setting the lower limits of the composition ratio of Ti and the composition ratio of Mg as shown above, respectively, the amount of the element added to suppress the valence fluctuation of Fe ions can be easily adjusted.

By setting the upper limits of the composition ratios of Ti and Mg as described above, respectively, the relative decrease in the ratio of Fe elements in the garnet single crystal can be prevented, and the light transmittance can be prevented from decreasing. Since a decrease in light transmittance can be prevented, the thickness of the single-crystal film required to rotate the polarization plane by a predetermined angle (e.g., 45 degrees) can be made thinner, resulting in advantages such as reduced manufacturing time for the single-crystal film and miniaturization of the Faraday rotator and optical isolator.

Furthermore, by balancing the difference between the composition ratio of Mg and the composition ratio of Ti and Pt combined in the composition formula (1) as described above as $-0.01 \le \{3-(a+b+c)\}-\{f+5-(d+e+f)\} \le 0.01$, the valence fluctuation of Fe ions can be suppressed while preventing a decrease in the light transmittance of garnet single crystals.

<Method for Producing Bismuth-Substituted Rare Earth Iron Garnet Single Crystal>

The bismuth-substituted rare earth iron garnet single crystal of the present invention may be grown with a PbO-free melt composition. A specific example of the method for producing bismuth-substituted rare earth iron garnet single crystal is explained below with reference to the flowchart shown in FIG. 1.

First, a garnet single-crystal substrate (hereinafter referred to as "base substrate") used as a substrate for the growth of bismuth-substituted rare earth iron garnet single crystal is prepared (Step S10). The substrate to be prepared may be, for example, a $Gd_3Ga_5O_{12}$ (GGG; gadolinium, gallium, garnet) single-crystal substrate to which Ca, Mg, Zr, Y, etc. is added. Such a substrate can be obtained by pulling a single crystal by the Choklarsky method.

Next, the metal oxide that will be the raw material for the bismuth-substituted rare earth iron garnet single crystal is melted in a platinum crucible to prepare the raw material melt (Step S20). The raw metal oxides include, for example, $Tb_4O_7$, $Eu_2O_3$, $Bi_2O_3$, $Fe_2O_3$, $Ga_2O_3$, $TiO_2$, and MgO. The raw material melt is prepared by preparing these metal oxides in predetermined portion ratios, putting them in a platinum crucible, and heating and melting them at a predetermined temperature. The amount of metal oxide to be put into the platinum crucible is determined by the molar weight ratio and converted to weight. The amount of Pt that will be dissolved out of the Pt crucible is determined experimentally by material analysis of a single crystal prepared with a composition that does not include Ti. The amount of $TiO_2$ and/or MgO to be added is adjusted to balance based on the amount of Pt to be dissolved.

Then, a single-crystal film is grown by bringing the base substrate in contact with the prepared raw material melt and pulling it up (step S30). The single-crystal film grown to the required thickness is then cut and polished to obtain a bismuth-substituted rare earth iron garnet single crystal that can be used for a Faraday rotator and an optical isolator (step S40).

Examples

In order to confirm the effectiveness of the present invention, bismuth-substituted rare earth iron garnet single crystals were prepared, and Faraday rotators made from these crystals were evaluated as follows.

Comparative Example

First, a garnet single-crystal substrate was prepared as a base substrate for growing a single-crystal film of bismuth-substituted rare-earth iron garnet crystals. The base substrate may be NOG (product name of Shin-Etsu Chemical Co., Ltd.) or SGGG (product name of Saint-Gobain), which is $Gd_3Ga_5O_{12}$ to which Ca, Mg, Zr, Y, etc. is added. Such substrates can be obtained by pulling a single crystal by the Choklarsky method. The lattice constant on this substrate was $12.496 \pm 0.004$ Å.

The raw material melt was then prepared as the raw material for bismuth-substituted rare earth iron garnet single crystals. As metal oxides, $Tb_4O_7$: 100.1 g, $Eu_2O_3$: 10.7 g, $Bi_2O_3$: 6320 g, $Fe_2O_3$: 320.8 g, and $Ga_2O_3$: 20.6 g were prepared, and these were placed in a platinum crucible and heated to 1100° C. to melt. Thereby the raw melt was obtained.

The raw material melt was then set to 795-787° C., and the substrate was brought into contact with and pulled up to obtain a garnet single-crystal film with a thickness of 598 μm.

The single-crystal film was analyzed by ICP and found to be the compound shown as $(TbEuBi)_3(FeGaPt)_5O_{12}$. That is, a garnet single-crystal film with conventional compositions was obtained, in which Pt derived from the platinum crucible was mixed in, while Ti and Mg were not added to suppress valence fluctuations of Fe ions due to Pt.

The single-crystal film was then peeled off from the substrate, the peeled single-crystal film was cut and polished, and the film surface was coated with an antireflection coating against air and cut to 1.5×1.5×0.465 mm. The magneto-optical properties at a wavelength of 1.55 μm of the single-crystal film after the cutting process were investigated, and the results were as follows: Faraday rotation angle of 45.0 degrees, optical absorption loss of 0.37 dB, and saturation magnetization of 350 G.

Example

Thirteen different raw material melts were prepared by placing oxides of Tb, Eu, Bi, Fe, and Ga in a platinum crucible in the same manner as the comparative example, and further adding $TiO_2$ in the range of 0 to 2.8 g and MgO in the range of 0 to 12 g, and heating to melt them. Thirteen different single-crystal films of bismuth-substituted rare earth iron garnet (composition No. 1-13) were prepared using these raw material melts. The results of the magneto-optical properties of each single-crystal film are shown in Table 1. A graph showing the relationship between the difference between the composition ratio of Mg and the composition ratio of Ti and Pt combined (substitution amount difference) and insertion loss is shown in FIG. 2.

TABLE 1

| No. | Mg Composition ratio 3 − (a + b + c) | Ti Composition ratio f | Pt Composition ratio 5 − (d + e + f) | {Mg − (Ti + Pt)} | Insertion loss [dB] | 45 deg thickness [μm] |
|---|---|---|---|---|---|---|
| 1 | 0.080 | 0.035 | 0.022 | 0.023 | 0.34 | 471 |
| 2 | 0.060 | 0.017 | 0.026 | 0.017 | 0.20 | 469 |
| 3 | 0.050 | 0.020 | 0.020 | 0.010 | 0.15 | 469 |
| 4 | 0.080 | 0.045 | 0.028 | 0.007 | 0.12 | 472 |
| 5 | 0.070 | 0.045 | 0.022 | 0.003 | 0.12 | 472 |
| 6 | 0.045 | 0.015 | 0.028 | 0.002 | 0.11 | 469 |
| 7 | 0.040 | 0.025 | 0.018 | −0.003 | 0.11 | 469 |
| 8 | 0.050 | 0.032 | 0.024 | −0.006 | 0.12 | 471 |
| 9 | 0.070 | 0.050 | 0.028 | −0.008 | 0.14 | 473 |
| 10 | 0.060 | 0.055 | 0.022 | −0.017 | 0.17 | 473 |
| 11 | 0.020 | 0.022 | 0.018 | −0.020 | 0.25 | 469 |
| 12 | 0.032 | 0.028 | 0.026 | −0.022 | 0.24 | 470 |
| 13 | 0.035 | 0.045 | 0.020 | −0.030 | 0.35 | 472 |

Figure 2:
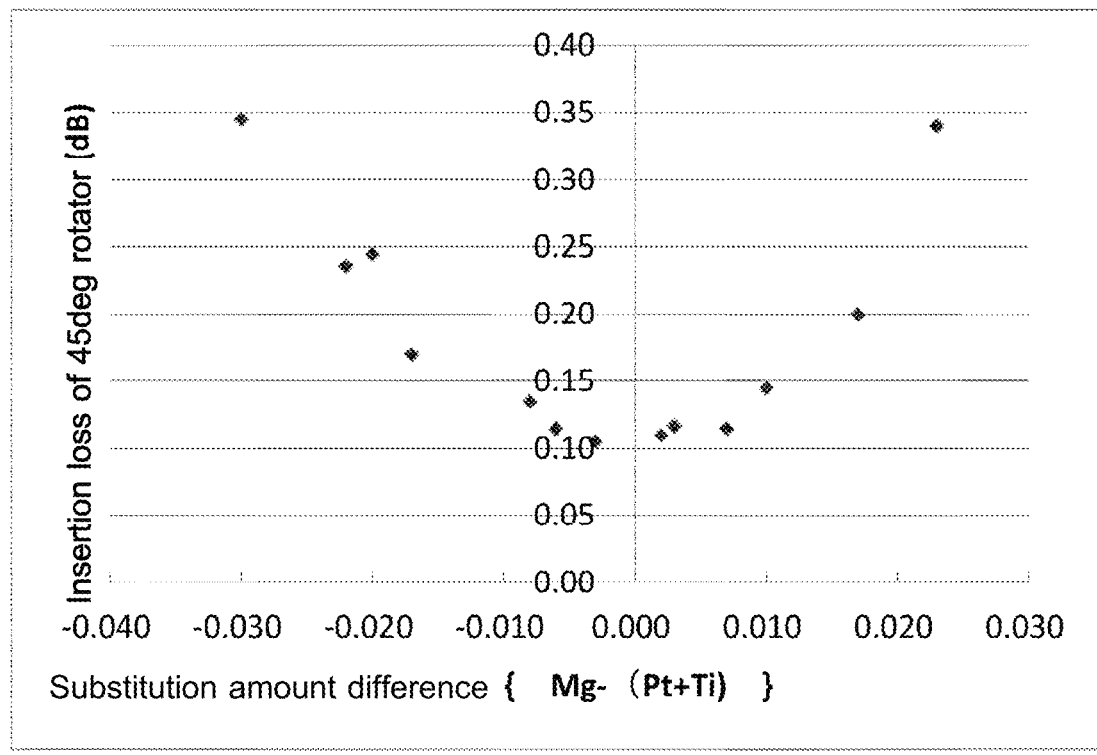
FIG. 2 shows the corresponding relationship between the difference between the composition ratio of Mg and the composition ratio of Pt and Ti combined and the insertion loss of the optical isolator.

As shown in Table 1 and FIG. 2, the addition of Mg and Ti tends to suppress insertion loss. In particular, the insertion loss of the optical isolator was found to be particularly low, less than 0.15 dB, when the substitution amount difference was in the range of −0.01 to 0.01 (compositions No. 3 to 9).

Even if the difference between the composition ratio of Mg and the composition ratio of Ti and Pt combined is in the range of −0.01 to 0.01, the thickness of the crystal required to rotate the polarization by 45 degrees increases as the amount of substitution increases because the composition ratio of Fe in the crystal decreases relatively. To achieve both miniaturizations of the optical isolator and reduction of insertion loss, the difference between the composition ratio of Mg and the composition ratio of Ti and Pt combined should be in the range of −0.01 to 0.01, and the composition ratio of Ti should be 0.05 or less, and the composition ratio of Mg should be 0.08 or less.

In general, it is very difficult to control the crystal composition uniformly in the plane with a small amount of additive elements. However, according to the present invention described above, by replacing the corresponding elements such as divalent and tetravalent, the growth condition range of single-crystal films can be relaxed, and it is easy to obtain single-crystal films of bismuth-substituted rare earth iron garnet with low insertion loss below 0.15 dB.

Although embodiments are described above, the present invention is not limited to these examples. For example, Eu was used as Ln in Examples 1 and 2 above, but rare earth elements selected from Gd, Ho, Tm, Yb, Lu, and Y other than Eu may be used as Ln, for example. Similar to the case with Eu, single-crystal films of bismuth-substituted rare-earth iron garnet with low insertion loss can be obtained with these elements by adding $TiO_2$ and MgO.

In addition, any addition, deletion, or design modification of components as appropriate by those skilled in the art to the aforementioned embodiments, as well as any combination of features of each embodiment as appropriate, are included within the scope of the invention as long as they provide the gist of the invention.

The invention claimed is:

1. A Bismuth-substituted rare earth iron garnet single crystal characterized by the composition formula $(Tb_aLn_b Bi_cMg_{3-(a+b+c)})(Fe_dGa_eTi_fPt_{5-(d+e+f)})O_{12}$, wherein in the composition formula above, $0.02 \leq f \leq 0.05$, $0.02 \leq \{3-(a+b+c)\} \leq 0.08$, and $-0.01 \leq \{3-(a+b+c)\}-\{f+5-(d+e+f)\} \leq 0.01$, and Ln is a rare earth element selected from Eu, Gd, Ho, Tm, Yb, Lu, and Y.

2. The bismuth-substituted rare earth iron garnet single crystal as claimed in claim 1, wherein the bismuth-substituted rare earth iron garnet single crystal is grown with a PbO-free melt composition.

3. A Faraday rotator comprising the bismuth-substituted rare earth iron garnet single crystal as claimed in claim 1.

4. An optical isolator comprising the Faraday rotator as claimed in claim 3.

5. A method for producing the bismuth-substituted rare earth iron garnet single crystal as claimed in claim 1 comprising:
   a step of preparing a garnet single-crystal substrate as a base substrate;
   a step of melting a metal oxide containing at least $TiO_2$ and MgO as raw materials in a platinum crucible to prepare a raw material melt; and
   a step of bringing the base substrate into contact with the raw material melt and pulling up the base substrate, thereby growing a bismuth-substituted rare earth iron garnet single crystal film.

6. The method according to claim 5, wherein the raw material melt has PbO-free composition.

* * * * *